United States Patent [19]

Fukaya

[11] 3,898,576

[45] Aug. 5, 1975

[54] DIRECT-COUPLED AMPLIFIER PROVIDED WITH NEGATIVE FEEDBACK

[75] Inventor: Hirokazu Fukaya, Tokyo, Japan

[73] Assignee: Nippon Electric Company, Limited, Tokyo, Japan

[22] Filed: Oct. 10, 1973

[21] Appl. No.: 405,185

[30] Foreign Application Priority Data

Oct. 11, 1972 Japan .............................. 47-102156

[52] U.S. Cl. .................... 330/28; 330/19; 330/30 D

[51] Int. Cl.$^2$ .............................................. H03F 1/08

[58] Field of Search ........ 330/17, 19, 28, 30 D, 149

[56] References Cited

UNITED STATES PATENTS 3,721,914 3/1973 Nakamura ......................... 330/28 X

*Primary Examiner*—R. V. Rolinec

*Assistant Examiner*—Lawrence J. Dahl

*Attorney, Agent, or Firm*—Hopgood, Calimafde, Kalil, Blaustein & Lieberman

[57] ABSTRACT

A direct-coupled amplifier circuit with negative feedback includes a first amplifier having an input terminal and a feedback terminal. A second amplifier further amplifies the signal amplified by the first amplifier, and a first resistor provides negative feedback of the second amplifier to the feedback terminal of the first amplifier. A series R-C circuit consisting of a capacitor and a second resistor is connected across the feedback terminal of the first amplifier and ground. A charging circuit charges the capacitor of the R-C circuit during the period immediately following the application of the power supply voltage, thereby to increase the voltage at the feedback terminal more rapidly than the voltage at the input terminal.

9 Claims, 6 Drawing Figures

DIRECT-COUPLED AMPLIFIER PROVIDED WITH NEGATIVE FEEDBACK

This invention relates to a direct-coupled amplifier provided with negative feedback, and more particularly, to a direct-coupled power amplifier having no output transformer.

Power amplifier circuits are generally provided with a negative feedback circuit for feeding back the output signal to the input stage or the former stage. In a conventional negative feedback circuit, a resistor having a resistance value sufficient for obtaining a predetermined amplification factor is connected between the output terminal and a feedback terminal of the input or former stage, and the feedback terminal of the input or former stage is grounded through a series R-C circuit consisting of a resistance for determining the amplification factor and a capacitor having a sufficiently large capacitance for passing the operating frequency.

In the voltage transient period that occurs upon the application of a power supply voltage, the bias voltage on the input terminal of the input stage rises more rapidly than that on the feedback terminal. This difference in charging rates at the input and feedback terminals results in the appearance of an abnormally high voltage at the output terminal. In a direct-coupled power amplifier using no output transformer, the abnormally high voltage is differentiated by the capacitance of an output capacitor and the resistance of a speaker voice coil, producing a differentiated pulse wave as a noise in the speaker. This noise is not only offensive to the listener but also causes the open-circuiting of the voice coil in the speaker.

Accordingly, an object of this invention is to provide a direct-coupled negative feedback amplifier circuit which prevents the appearance of an abnormally high voltage noise of the differentiated wave form at the output terminal upon the application of a power supply voltage.

The direct-coupled amplifier circuit with negative feedback circuit according to this invention comprises a first amplifier circuit having an input terminal and a feedback terminal. A second amplifier circuit further amplifies the signal amplified by the first amplifier circuit and a first resistor provides negative feedback of the output signal of the second amplifier circuit to the feedback terminal of the first amplifier circuit. A series R-C circuit consisting of a capacitor and a second resistor is connected across the feedback terminal of the first amplifier circuit and ground. Means are provided to charge the capacitor of the series R-C circuit during the voltage transient period immediately following the application of a power supply voltage, so as to raise the voltage at the feedback terminal more rapidly than the voltage at the input terminal.

Since the voltage at the feedback terminal of the first amplifier circuit is raised more rapidly than that at the input terminal at the time of power source application, the potential at the output terminal is rised up slowly. This results in the elimination of the possiblity of an abnormally high and sharply standing pulse appearing at the output terminal upon the application of the power supply voltage. In a power amplifier having the novel features of this invention, in particular, there is no possibility that the listener will hear offensive noises or that the speaker voice coil will be open-circuited.

The above and further objects, features, and advantages of the present invention will become apparent from the following detailed description of embodiments of this invention taken in conjunction with the accompanying drawings, wherein.

Figure 1:
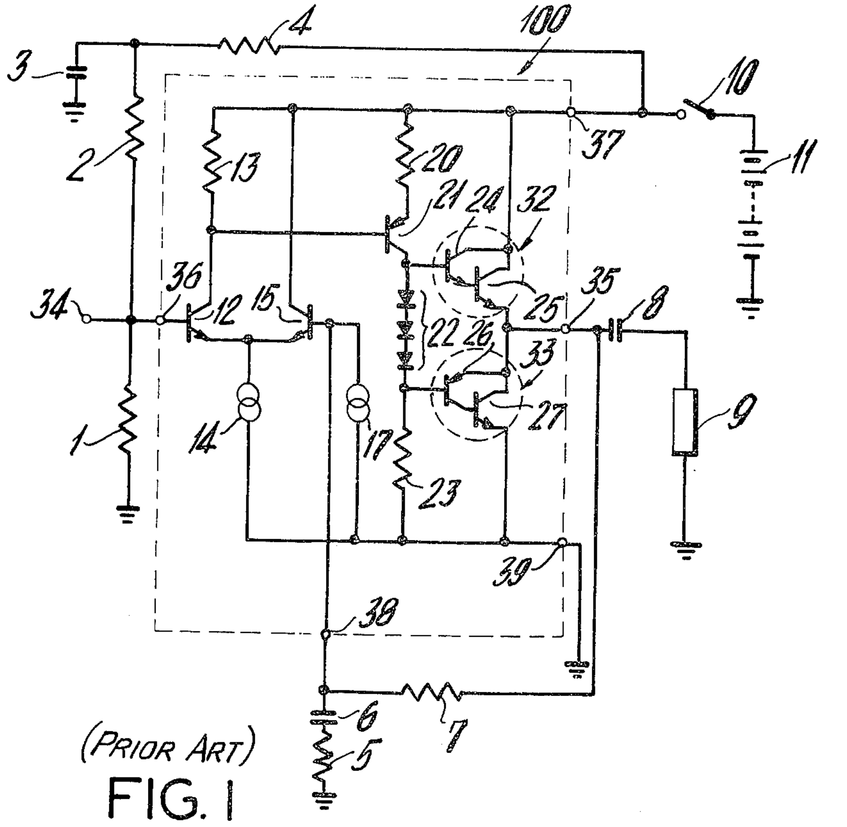
(PRIOR ART) FIG. 1
FIG. 1 is a circuit diagram of a conventional power amplifier.

Referring not to the conventional direct-coupled power amplifier of the single-ended push-pull type illustrated in FIG. 1, an input signal applied to an input terminal 34 undergoes successive amplification by a differential amplifier composed of transistors 12 and 15, a constant-current source 14, resistor 13, and by a driver transistor 21. The signal is further amplified by a single-ended push-pull circuit composed of direct-coupled transistor structures 32 and 33, so that an amplified output signal is obtained at a load 9 through the capacitor 8. An output signal available from an output terminal 35 is level-shifted by a current fed to a resistor 7 from a constant-current source 17 and is then fed back to the base electrode of transistor 15 through a negative feedback circuit consisting of resistors 5 and 7 and a capacitor 6.

A power supply voltage that has passed through a switch 10 from a power supply 1., after it has been smoothed or filtered by a resistor 4 and a decoupling capacitor 3, is divided into two parts by a voltage divider including resistors 1 and 2 to apply a bias voltage to the base of transistor 12. The output stage of the amplifier is constituted by a single-ended push-pull circuit formed by direct-coupled transistor structures 32 and 33. Transistor structure 32 consists of two npn transistors 24 and 25 connected as a Darlington connection, and operates as an equivalent npn transistor. The other transistor structure 33 consists of a pnp transistor 26 and an npn transistor 27 connected as a complementary connection, and operates as an equivalent pnp transistor. Across the base-equivalent terminals of transistor structures 32 and 33 is connected a level shift circuit 22 in which three diodes are serially connected in the forward direction so as to stabilize the voltage across the base-equivalent terminals.

Level shift circuit 22 is connected between the collector of driver transistor 21 and a resistor 23, and an emitter resistance 20 is connected to the emitter of driver transistor 21. A major portion 100 of this amplifier circuit, enclosed by the dashed line in FIG. 1, is formed as a semiconductor integrated circuit and terminals 35, 36, 37, 38 and 39 are realized as external terminals of this integrated circuit.

Figure 3:
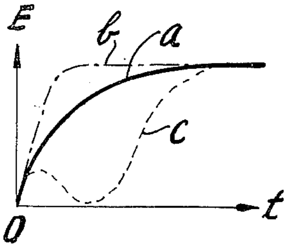
FIG. 3 is a graphical representation of the initial transient responses of the terminal voltages for the amplifier shown in FIGS. 1 and 2.

At the moment power switch 10 is turned on, a voltage divided by resistors 1 and 2 is applied to terminal 36 (or 34) which rises with a time constant determined by resistor 4 and capacitor 3, as illustrated by the solid curve *a* in FIG. 3. Transistor 12 first becomes conductive with an increase in the voltage drop of resistor 13. Transistor 21 also begins to be conductive with an increase in the collector voltage, resulting in an increase in the emitter voltage of transistor structure 32. Since capacitor 8 is charged through the low impedance of transistor 25, the voltage on output terminal 35 rises rapidly. This voltage at output terminal 35 is applied to feedback terminal 38 through resistor 7. The time constant determined by capacitor 6 and resistor 5 is designed sufficiently large with respect to an ordinary operating frequency and resistor 7 has a sufficiently large resistance value as compared to resistor 5 to secure a sufficient voltage gain. Since the rise of the voltage at feedback terminal 38 is governed by a time constant given by the resistance value of resistor 7 and the capacitance value of capacitor 6, this rise time is retarded by the relatively large resistance value of resistor 7.

In particular, in this conventional circuit configuration, the DC feedback effciency is surpassed by the operation of constant-current source 17, but the problem of the slow rise time still remains unsolved, as detailed hereafter. Constant-current source 17 is usually transistorized and remains inoperative under a certain voltage. Thus, the voltage at feedback terminal 38 rises as indicated by the dashed curve *b*, delayed with respect to the solid curve *a* in FIG. 3. That is, steady-state operation of the prior art amplifier of FIG. 1 cannot be commenced until the voltage at output terminal 35 builds up near the source voltage and hence, the point of intersection between the two curves *a* and *b* is reached.

Accordingly, in a conventional direct-coupled power amplifier, the rise times of the input terminal voltage and the feedback terminal voltage are often different from each other after the closing of the power switch, the latter voltage usually rising slower than the former.

For this reason, a voltage near in magnitude to the power source voltage and having a sharply rising wave form may appear at the output terminal. Since this voltage is differentiated by the resistance of a voice coil of a loudspeaker, as indicated by a load 9 and output capacitor 8, a large pulsed voltage having a differentiated wave form is applied to the speaker voice coil to produce abnormal noise or to cause the open-circuiting of the voice coil.

In the conventional amplifier of FIG. 1, the output is derived from a point between output terminal 35 and ground. However, the same defect also exists in the case where an output is derived between output terminal 35 and power supply terminal 37.

As can be seen in FIG. 3, a hump is produced in the vicinity of $t = 0$ (where $t$ represents the elapse of time from a time point to when switch 10 is turned on) of the dashed curve *b*. This is because the voltage in this period below the operating voltage of constant current source 17 rises with a time constant determined by resistor 7 and capacitor 6, then after constant-current source 17 operates, the charge on capacitor 6 rushes into constant-current source 17 and the voltage increases again with increasing voltage on terminal 35.

Figure 2:
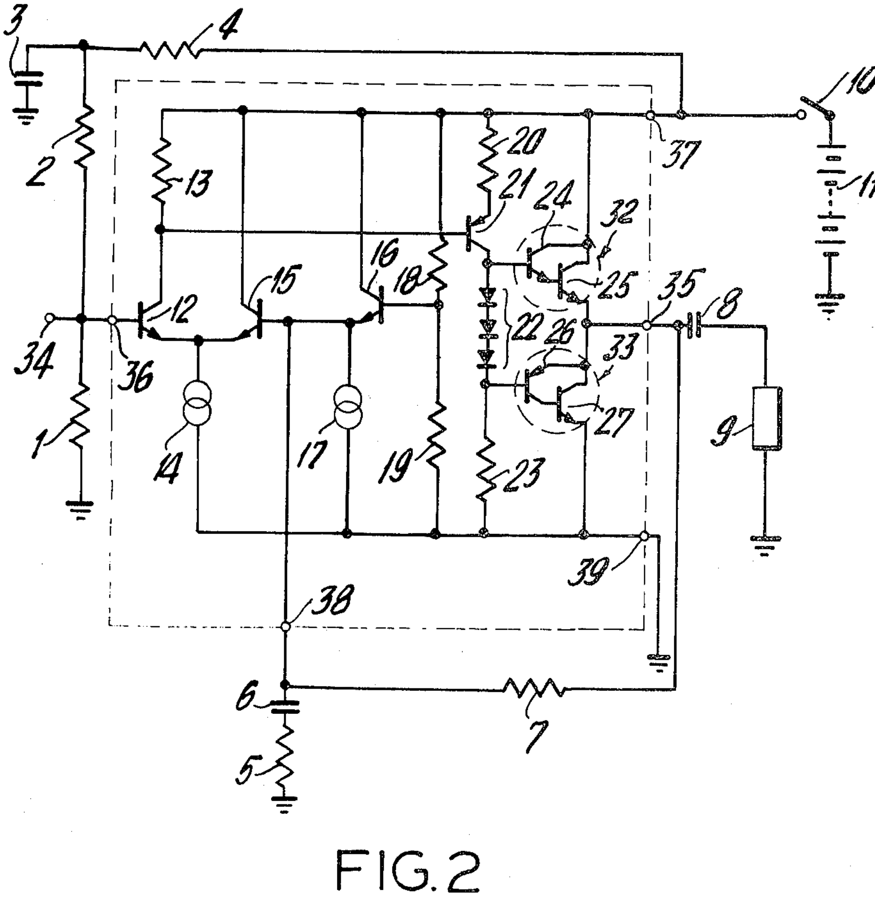
FIG. 2 is a circuit diagram of a direct-coupled power amplifier according to an embodiment of this invention.

Referring now to FIG. 2, which illustrates a direct-coupled amplifier according to a first embodiment of this invention, the same reference numerals as used in FIG. 1 are used for identical components. Compared with the conventional amplifier of FIG. 1, the amplifier of FIG. 2 includes a transistor 16 connected between power supply terminal 37 and ground terminal 39. The emitter of transistor 16 is connected to the base of transistor 15, and the collector of transistor 16 is connected to power supply terminal 37. The base of transistor 16 is connected to the junction of resistors 18 and 19 connected in series across power supply terminal 37 and ground terminal 39. The resistance values of resistors 18 and 19 are so set that the transistor 16 remains conducting until the bias voltage of feedback terminal 38 rises to a steady-state after the closure of power switch 10 and transistor 16 is turned off while the bias voltage of the feedback terminal 38 is in the steady-state.

On closing power switch 10, the voltage on input terminal 36 builds up with a time constant determined by the resistance value of resistor 4 and the capacitance value of capacitor 6 in a manner shown by the solid curve *a* in FIG. 3. On the other hand, since the base bias voltage of transistor 16 is determined by the power source voltage divided by the resistors 18 and 19, a voltage is produced on the emitter of transistor 16,, which is proportional to the rising voltage of the power source as shown by the dot-dash curve *c* in FIG. 3. Further, since the emitter of transistor 16 is connected to the base of transistor 15, the base bias voltage of transistor 15 is compulsorily pulled up. On the other hand, capacitor 6, which is charged through the low operating resistance of transistor 16, is rapidly charged. Still further, since the base of transistor 15 should be biased by the voltage at output terminal 35 under the steady-state condition, transistor 16 is so set as to turn off in the steady-state, in order not to disturb the base bias voltage of transistor 15.

As a result, in the initial transient period after the closure of the power switch, a bias voltage higher than that at the input terminal is applied to the feedback terminal. This eliminates the possibility of an abnormally high voltage noise of a differentiated wave form being detected at the output. Thus, the listener will not be annoyed with offensive noises and the possibility of damage to the speaker voice coil is eliminated.

Further, since no capacitor is needed for the prevention of the undesired noise occurring upon the closure of the power switch, the circuit of FIG. 2 is well adapted for fabrication as a semiconductor integrated circuit.

A variation of the first embodiment of this invention as illustrated in FIG. 2, provides a direct-coupled power amplifier in which the base bias for transistor 15 is formed by using a resistor in place of constant-current source 17. The same effect as from the first embodiment can be expected by this variation.

Figure 4:
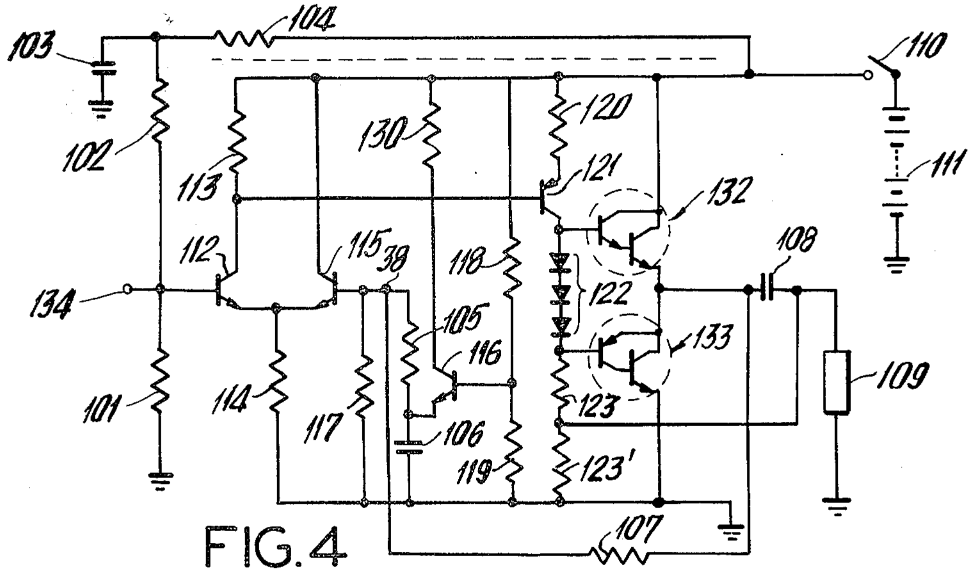
FIG. 4 is a circuit diagram of a direct-coupled power amplifier circuit according to a second embodiment of this invention.

A power amplifier of the direct-coupled type according to a second embodiment of this invention is shown in FIG. 4. According to this embodiment, a capacitor 106 in the negative feedback circuit is grounded and the emitter of a transistor 116 for charging capacitor 106 and pulling up the bias voltage at feedback terminal 38 in the transient period after the closure of the power switch is tied to the junction of a capacitor 106 and a resistor 105 as shown in FIG. 4.

An input signal applied to an input terminal 134 is amplified in succession by the differential amplifier consisting of transistors 112, 115 and resistors 113, 114, a driver transistor 121, and direct-coupled transistor structures 132 and 133 which are connected in a single-ended push-pull configuration. The amplified signal is applied via a coupling capacitor 108 to a load 109 such as a loudspeaker. The output signal is fed back to the junction of resistors 123 and 123' to obtain the bootstrap effect and at the same time, to a negative feedback circuit consisting of resistors 107 and 105 and capacitor 106.

A bias voltage is applied to the base of transistor 112 via a switch 110 and filter consisting of a resistor 104 and a capacitor 103 from a power supply 111 and voltage-divided by a voltage divider formed of resistors 101 and 102. A bias voltage is applied to transistor 115 by dividing the potential of the junction of the equivalent emitter of transistor structures 132 and 133 through resistors 107 and 117.

The emitter of transistor 116 is connected to the junction of capacitor 106 and resistor 105, and a voltage developed by dividing the voltage of power supply 111 through resistors 118 and 119 is applied to the base of transistor 116. Further, the collector of transistor 116 is connected to the anode electrode of power supply 111 via a current-limiting resistor 130. A serial diode circuit 122 stabilizes the inter-base voltage of direct-coupled transistor structures 132 and 133, and an emitter resistance 120 is provided for transistor 121.

In this embodiment of FIG. 4, as in the previously described embodiment, resistors 118 and 119 are set to resistance values so as to make transistor 116 operate in the cutoff state in the steady-state operation of the amplifier. Therefore, the equivalent effect as in the first described embodiment can be expected.

In the embodiment of FIG. 4, capacitor 106 with one plate grounded is charged through a low operating resistance of transistor 116 in a transient period after the closure of the power switch, it being preferred to install a current-limiting resistor 130 to protect transistor 116 from breakdown. In other words, provided the power capacity of transistor 116 is sufficiently large, resistor 130 can be dispensed with and a more rapid rise time of the base bias voltage can be obtained.

Figure 5:
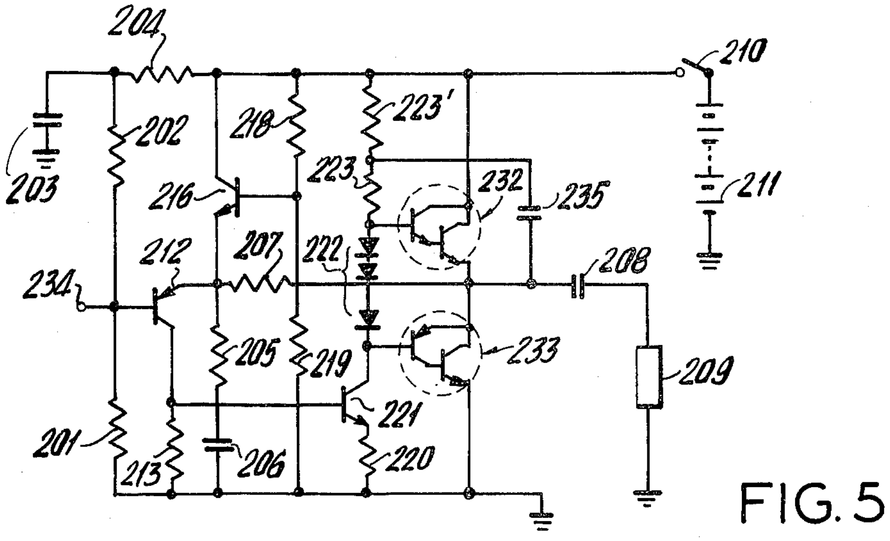
FIG. 5 is a circuit diagram of a direct-coupled power amplifier according to a third embodiment of this invention.

FIG. 5 illustrates a circuit diagram according to of a third embodiment of this invention, wherein there is shown a power amplifier with an input stage in which no differential amplifier is contained.

In this embodiment, an input signal applied to an input terminal 234 is amplified by a transistor 212 and is transferred to a driver transistor 221 via a load resistor 213 to undergo power amplification by direct-coupled transistor structures 232 and 233 connected in a single-ended push-pull configuration. The amplified signal is then delivered to a load 209 via an output capacitor 208. The base bias voltage for transistor 212 is derived from a power supply 211 via a power switch 210, after the power supply voltage has been passed through a filter composed of a resistor 204 and a capacitor 203 and divided by a voltage divider consisting of resistors 201 and 202. The output is fed back through a capacitor 235 to the junction of resistors 223 and 223' to obtain the bootstrap effect and, at the same time, to the feedback terminal via the resistor 207 to obtain a negative feedback effect in cooperation with resistor 205 and capacitor 206.

Both the collector and the emitter of transistor 216 are connected between the anode of power supply 211 and the emitter of transistor 212, thereby contriving to rapidly increase the emitter bias voltage of transistor 212 upon the closure of power switch 210. Theh voltage divided voltage divider formed by resistors 218 and 219 is set equal to a value higher than the emitter bias voltage at this time by the magnitude of the base-emitter forward junction voltage of transistor 216, so as to be capable of turning off transistor 216 when capacitor 206 is fully charged to reach the steady-state.

The embodiment of FIG. 5 can also display the same effect as the embodiment of FIG. 2. The embodiment of FIG. 5, however, has certain advantages over the ones previously described in that it permits the fabrication of a direct-coupled power amplifier having a minimum number of components, because no differential amplifier is employed.

Figure 6:
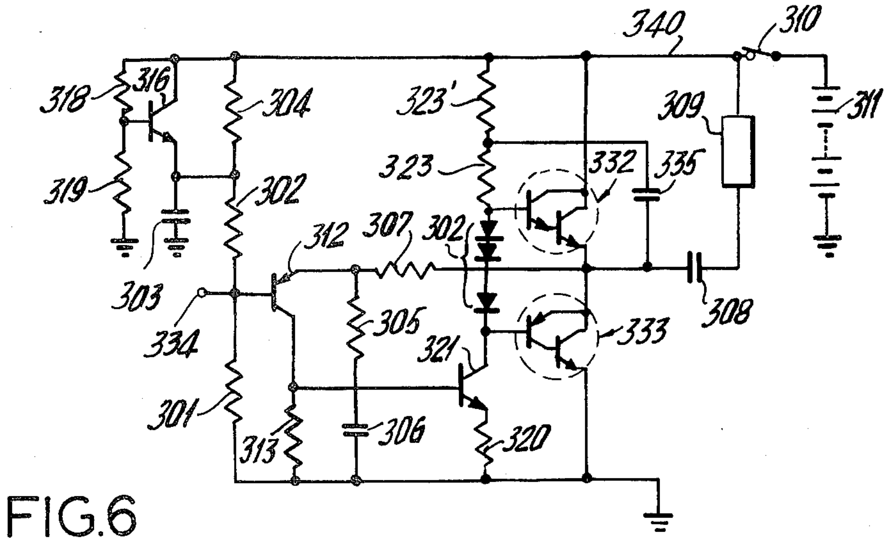
FIG. 6 is a circuit diagram of a direct-coupled power amplifier according to a fourth embodiment of this invention.

Referring now to FIG. 6, there is shown a fourth embodiment of this invention which relates to a circuit wherein a load 309 such as a loudspeaker is connected between the output terminal and a power supply line 340.

In this circuit, a signal applied to an input terminal 334 is first amplified by a transistor 312. The base of transistor 312 is biased by a voltage divided by a voltage divider composed of series-connected resistors 301 and 302 which are electrically connected to a power supply line 340 through a filter made up of a resistor 304 and a capacitor 303. The signal amplified by transistor 312 is derived from a resistor 313 as a load, and is applied to the base of a driver transistor 321. The signal amplified by transistor 321 is derived from resistors 323 and 323', and is applied to a power-amplifying stage of the direct-coupled transistor structures 332 and 333 which are connected to form a single-ended push-pull circuit configuration. The series connection 322 of diodes is inserted between the bases of transistor structures 332 and 333 for thermal stabilization. A resistor 320 serves as an emitter resistor of transistor 321.

The output of the power amplifying stage is derived from load 309 through an output capacitor 308. A capacitor 335 is connected between the output terminal and the junction of resistors 323 and 323' to obtain a bootstrap effect. The output of power amplifying stage is fed back to a emitter (which is a feedback terminal) of the transistor 312 through the feedback circuit made up of resistors 305 and 307 and capacitor 306. Charging means made of a transistor 316 and resistors 318 and 319 is arranged to charge capacitor 303 and to build up the bias voltage at input terminal 334 more rapidly than that at the emitter of transistor 312, or at a feedback terminal, upon the application of the power supply voltage. The voltage established by the voltage divider resistors 318 and 319 is designed to turn transistor 316 to the cut-off condition at the steady-state period of the voltage of capacitor 303.

In the circuit of FIG. 6 wherein load 309 is connected to power supplying line 340, if the bias voltage at the emitter of transistor 312 (a feedback terminal) rises more rapidly than that at input terminal 334, the abnormally high and differentiated wave form noise appears at load 309. This condition is produced when the time constant obtained from resistance of resistor 304 and the capacitance of capacitor 303 is larger than that from resistor 307 and capacitor 306.

In the embodiment of FIG. 6, the charging means rapidly charges capacitor 303 and rapidly build up the bias voltage at the input terminal 334. Therefore, the potential of the emitter of transistor structure 332, which is the output terminal, slowly falls from the potential of power supply line 340. This prevents the appearance of a noise of an abnormally high peak voltage and differentiated wave form at load 309.

Although an amplifier circuit using a bipolar transistor, such as transistors 16, 116, 216 and 316, has been herein specifically described as the means for charging the capacitors 6, 106, 206 and 303,, this invention is by no means restricted to these embodiments. A diode or a field-effect transistor, for instance, may be used in place of the transistor 16, 116, 216 or 316, provided that it produces a voltage proportional to the rise time of the power supply voltage, has a low operating resistance, and fully resides at a cut-off state in the steady state of capacitors 6, 106, 206, or 303. In this case, the diode has a higher operating resistance than the bipolar transistor or the field-effect transistor. Therefore, the latter is preferably employed.

A further advantage of this invention is the dispensability of a capacitor, making applications in a semiconductor integrated circuit extremely attractive. It will thus be appreciated that variations and modifications of the embodiments of the invention herein specifically described may be made by those skilled in the art to which the present invention pertains, all without departing from the spirit and scope of the invention.

What is claimed is:

1. A direct-coupled amplifier comprising:

a power supply terminal;

a first amplifier stage connected to said power supply terminal;

a second amplifier stage connected to receive the output of the first amplifier stage for further amplification;

a load connected to receive the output of the second amplifier stage and connected to ground; and a feedback circuit including a first resistor for providing negative feedback from the output of said second amplifier stage to the input side of said first amplifier stage, a series-connected capacitor and second resistor connected between said first amplifier stage and ground, and transistor means connected to said feedback path for charging said capacitor to raise the feedback voltage across said capacitor more rapidly than the voltage at said power supply terminal upon the initial application of a power supply voltage to said power supply terminal, thereby preventing spurious output during the transient period following the application of a power supply voltage.

2. The direct-coupled amplifier of claim 1, wherein said charging means comprises a bipolar transistor having an emitter and a collector respectively connected to said first amplifier stage and to said power supply terminal.

3. The direct-coupled amplifier circuit of claim 1, wherein said second amplifier stage constitutes a power amplifier circuit.

4. The direct-coupled amplifier of claim 2, in which said charging means further comprises third and fourth resistors serially connected to said power supply terminal, the base of said bipolar transistor being connected to the junction of said third and fourth resistors.

5. The direct-coupled amplifier of claim 1, wherein said charging means includes a bipolar transistor connected to the junction of said capacitor and said second resistor.

6. The direct-coupled amplifier of claim 5, in which said charging means further comprises third and fourth resistors serially connected to form a voltage divider connected to the power supply terminal, the base of said bipolar transistor being connected to the junction of said third and fourth resistors.

7. The direct-coupled amplifier of claim 1, in which said charging means comprises a bipolar transistor having an emitter and a collector respectively coupled to said first amplifier stage and one electrode of the power supply terminal.

8. The direct-coupled amplifier of claim 7, in which said charging means further comprises third and fourth resistors serially connected to said power supply terminal, the base of said bipolar transistor being connected to the junction of said third and fourth resistors.

9. A direct-coupled amplifier comprising:

a power supply terminal;

a first amplifier stage having an input terminal connected to said power supply terminal;

means for biasing said input terminal including a first capacitor for eliminating A.C components;

a second amplifier stage connected to said first amplifier stage for further amplifying the output thereof;

a load connected between said power supply terminal and the output side of said second amplifier stage;

a negative feedback path connecting the output of the second amplifier stage to the first amplifier stage;

a series circuit including a second capacitor and a resistor connected between said feedback path and ground; and transistor means connected to said feedback path for charging said first capacitor so as to raise the bias voltage of said first amplifier stage more rapidly than the voltage supplied by said feedback path thereby preventing spurious output during the transient period following the application of a power supply voltage.

* * * * *